United States Patent
Harvilchuck et al.

(10) Patent No.: US 9,851,764 B2
(45) Date of Patent: Dec. 26, 2017

(54) MODULAR DATA STORAGE SYSTEM

(71) Applicant: Seagate Technology LLC, Cupertino, CA (US)

(72) Inventors: Laurence A. Harvilchuck, Brackney, PA (US); Alexander C. Worrall, Waterlooville (GB)

(73) Assignee: Seagate Technology LLC, Cupertino, CA (US)

( * ) Notice: Subject to any disclaimer, the term of this patent is extended or adjusted under 35 U.S.C. 154(b) by 26 days.

(21) Appl. No.: 14/832,676

(22) Filed: Aug. 21, 2015

(65) Prior Publication Data

US 2016/0057886 A1    Feb. 25, 2016

Related U.S. Application Data

(60) Provisional application No. 62/040,245, filed on Aug. 21, 2014.

(51) Int. Cl.

| | |
|---|---|
| *G06F 1/16* | (2006.01) |
| *G06F 1/18* | (2006.01) |
| *H05K 5/02* | (2006.01) |
| *H05K 5/00* | (2006.01) |
| *H05K 7/14* | (2006.01) |
| *G06F 1/20* | (2006.01) |

(52) U.S. Cl.
CPC .............. *G06F 1/187* (2013.01); *G06F 1/185* (2013.01); *G06F 1/20* (2013.01); *H05K 5/0021* (2013.01); *H05K 5/0217* (2013.01); *H05K 5/0221* (2013.01); *H05K 5/0226* (2013.01); *H05K 7/1405* (2013.01); *H05K 7/1411* (2013.01); *H05K 7/1489* (2013.01)

(58) Field of Classification Search
CPC .. H05K 7/1405; H05K 7/1411; H05K 5/0021; H05K 5/0217; H05K 5/0221; H05K 5/0226; H05K 7/1489; G06F 1/185
See application file for complete search history.

(56) References Cited

U.S. PATENT DOCUMENTS

| | | | |
|---|---|---|---|
| 4,504,936 A | 3/1985 | Faber et al. | |
| 7,054,144 B2 | 5/2006 | Heistand, II et al. | |
| 7,245,632 B2 | 7/2007 | Heffernan et al. | |
| 7,515,427 B2 | 4/2009 | King, Jr. et al. | |
| 8,060,671 B2 * | 11/2011 | Southerland | H05K 7/1411 710/62 |
| 8,135,494 B2 | 3/2012 | Jesionowski et al. | |
| 8,879,270 B2 | 11/2014 | Chen et al. | |
| 8,902,601 B2 * | 12/2014 | Trotman | H05K 7/1402 361/679.38 |
| 9,198,321 B1 * | 11/2015 | Heydari | H05K 7/1488 |
| 2004/0069518 A1 * | 4/2004 | Fan | H05K 5/0021 174/50 |
| 2006/0261015 A1 * | 11/2006 | Blackwell | H05K 7/1425 211/26 |

(Continued)

*Primary Examiner* — Zachary M Pape
*Assistant Examiner* — Douglas Burtner
(74) *Attorney, Agent, or Firm* — Hall Estill Attorneys at Law

(57) ABSTRACT

A modular data storage system can consist of at least first and second enclosures spanning a single pair of rails. The first and second enclosures may each have keyed couplers that mate to align the first and second enclosures along a common plane while being suspended between the single pair of rails.

20 Claims, 5 Drawing Sheets

(56) References Cited

U.S. PATENT DOCUMENTS

| | | | | |
|---|---|---|---|---|
| 2007/0180164 A1* | 8/2007 | Southerland | ......... | H05K 7/1439 710/62 |
| 2012/0079791 A1* | 4/2012 | Lord | ................... | H05K 5/0021 52/775 |
| 2012/0206876 A1* | 8/2012 | Chen | ................... | H05K 5/0021 361/679.58 |
| 2012/0243178 A1* | 9/2012 | Zhang | .................... | G06F 1/187 361/695 |
| 2013/0180935 A1* | 7/2013 | Lee | ........................ | G06F 1/187 211/41.12 |
| 2013/0217256 A1* | 8/2013 | Dudemaine | ............ | H01R 13/46 439/352 |
| 2013/0229766 A1* | 9/2013 | Williams | .................. | G06F 1/16 361/679.33 |
| 2014/0189891 A1* | 7/2014 | Wu | ........................ | G06F 21/88 726/35 |
| 2014/0204525 A1* | 7/2014 | Pecone | ................. | H05K 13/00 361/679.33 |
| 2014/0319017 A1* | 10/2014 | Lu | .......................... | G06F 1/187 206/565 |
| 2014/0334084 A1* | 11/2014 | Fricker | ................... | H05K 1/14 361/679.4 |
| 2015/0043151 A1* | 2/2015 | Cravens | ................. | G06F 1/187 361/679.37 |
| 2016/0165743 A1* | 6/2016 | Milligan | ............. | H05K 7/1409 361/679.31 |
| 2016/0179131 A1* | 6/2016 | Chen | ....................... | G06F 1/187 361/679.58 |
| 2017/0092335 A1* | 3/2017 | Schroeder | ............ | H05K 7/1489 |
| 2017/0094828 A1* | 3/2017 | Van Pelt | .................. | H05K 7/18 |

* cited by examiner

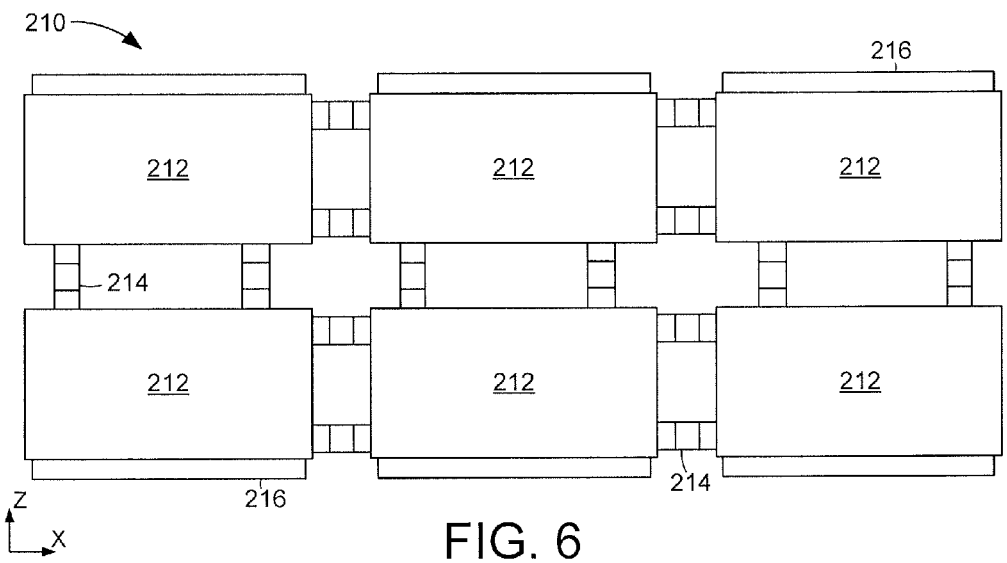
FIG. 6
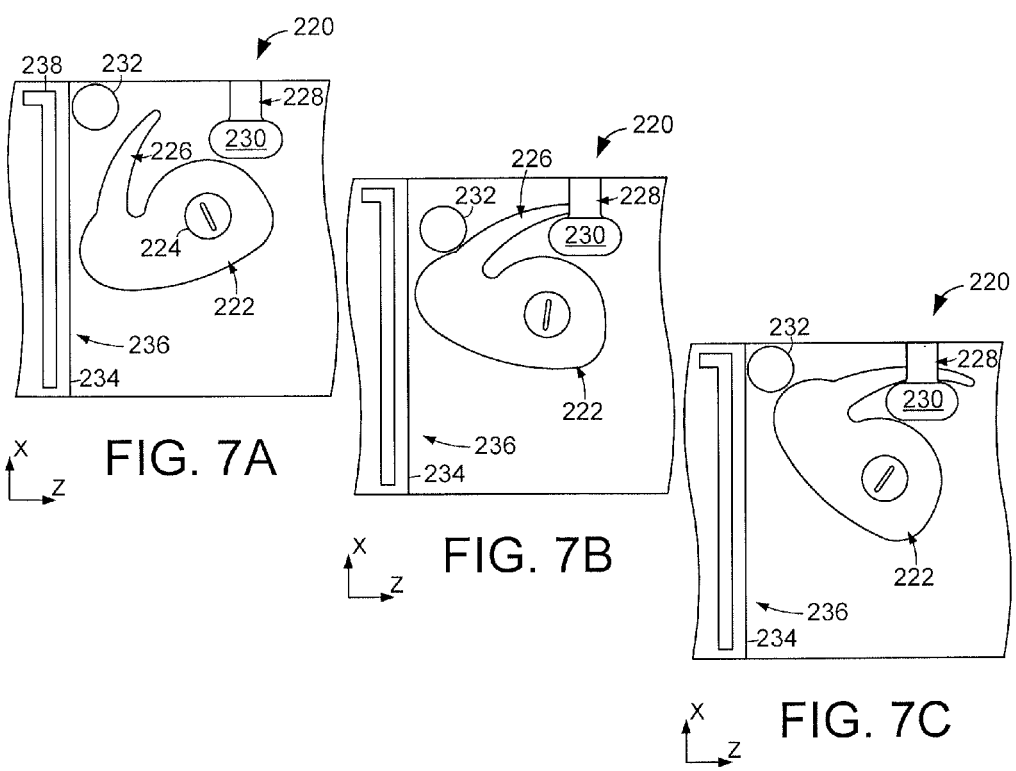
FIG. 7A
FIG. 7B
FIG. 7C

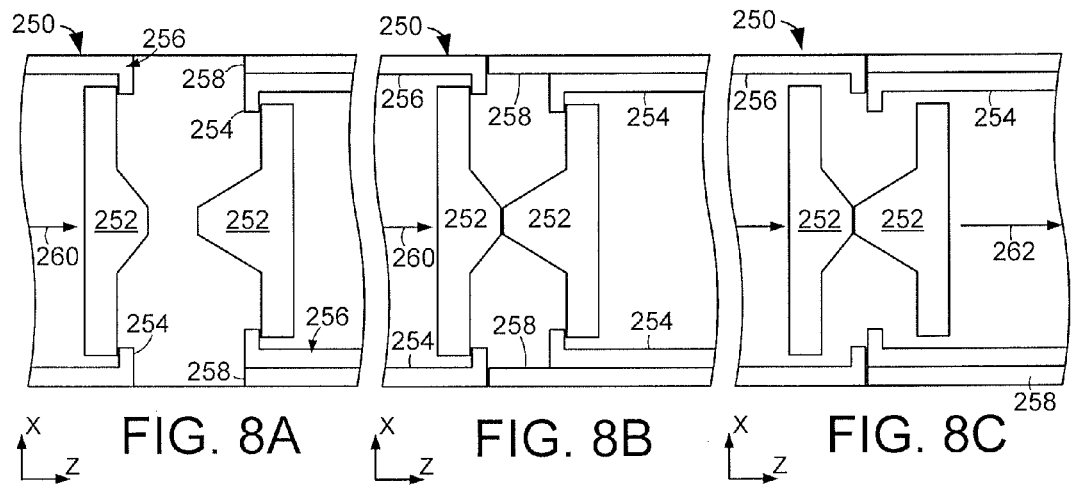
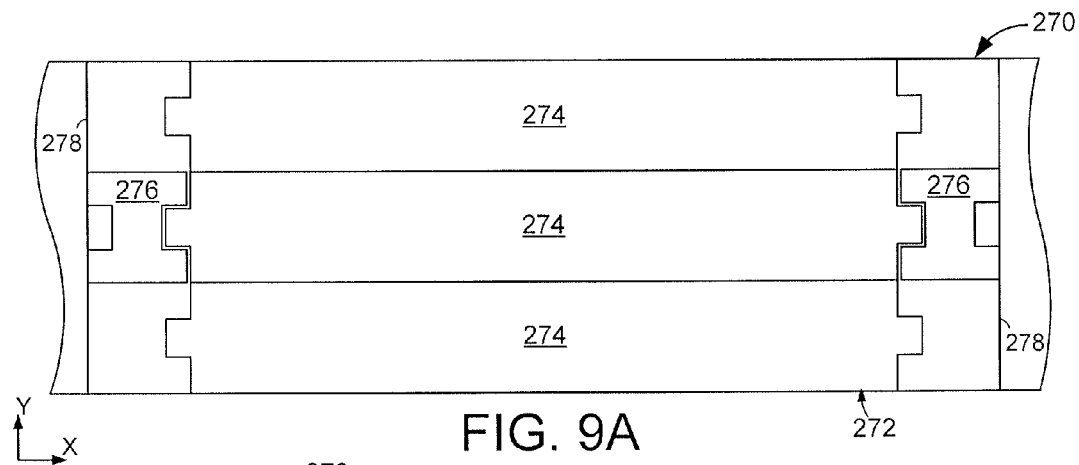
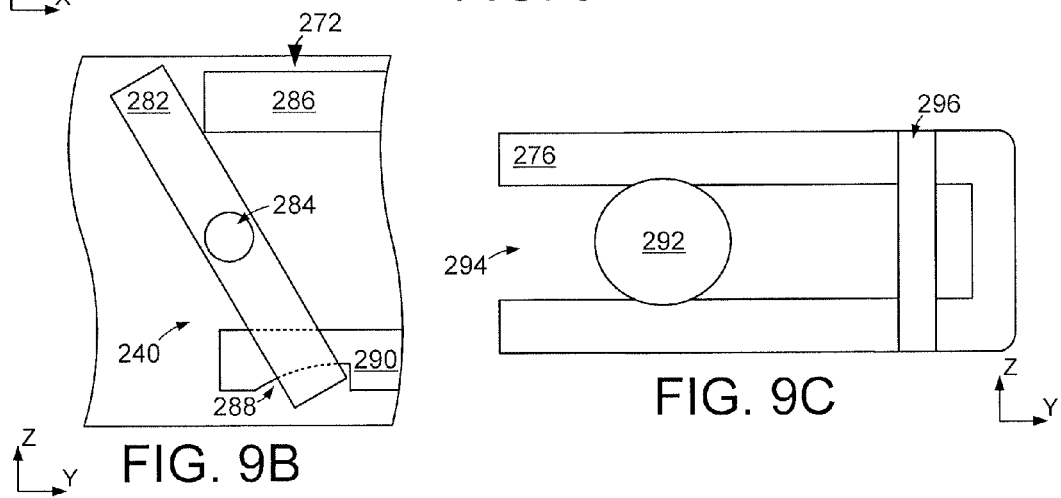

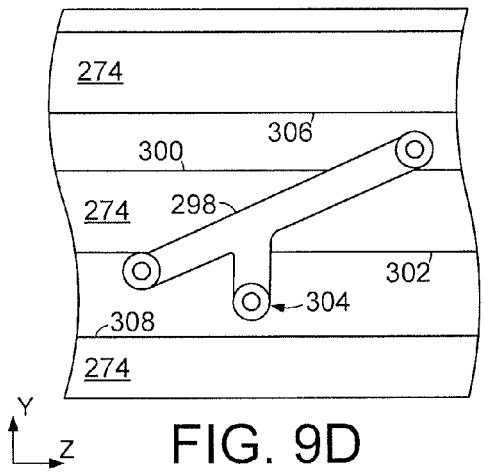
FIG. 9D
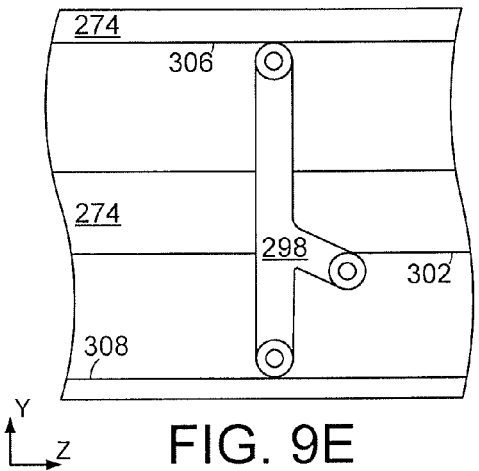
FIG. 9E
| 310 | MODULAR ENCLOSURE ROUTINE |
|---|---|
| 312 | AFFIX AT LEAST ONE KEYED COUPLER AND RAIL PROTRUSION TO OPPOSITE SIDES OF FIRST AND SECOND ENCLOSURES |
| 314 | MATE THE KEYED COUPLERS OF THE FIRST AND SECOND ENCLOSURES |
| 316 | COLLECTIVELY SLIDE THE ENCLOSURES BETWEEN A SINGLE PAIR OF RAILS |
| 288 | APPLY FORCE OPPOSITE TO GRAVITY TO DISENGAGE KEYED COUPLERS |
FIG. 10

MODULAR DATA STORAGE SYSTEM

RELATED APPLICATION

The present application makes a claim of domestic priority under 35 U.S.C. §119(e) to U.S. Provisional Application No. 62/040,245 filed Aug. 21, 2014, the contents of which are incorporated by reference.

SUMMARY

A modular data storage system, in some embodiments, has first and second enclosures spanning a single pair of rails. The first and second enclosures each have keyed couplers that mate to align the first and second enclosures along a common plane while being suspended between the single pair of rails.

BRIEF DESCRIPTION OF THE DRAWINGS

FIG. 6 displays a top view line representation of an example data storage tray constructed in accordance with some embodiments.

FIGS. 7A, 7B, and 7C respectively are line representations of a portion of an example data storage system operated in accordance with some embodiments.

FIGS. 8A, 8B, and 8C respectively are line representations of a portion of an example data storage system configured in accordance with some embodiments.

FIGS. 9A-9E respectively convey line representations of various portions of an example data storage system configured in accordance with some embodiments.

FIG. 10 is a flowchart of an example modular enclosure routine conducted in accordance with some embodiments.

DETAILED DESCRIPTION

Increases in the computing power of semiconductor electronics has complemented decreasing semiconductor form factors to allow for the proliferation of data collection devices like laptop computers, smartphones, tablet computers, and digital media recorders. The heightened number of data collection devices has corresponded with increased data size to stress the data capacity of some data storage systems. The advent of remote data storage systems, such as with cloud computing, further stresses the ability of individual data storage devices, as well as arrays of interconnected data storage devices, to provide adequate data capacity and data access times.

Accordingly, data storage systems with numerous data storage devices were created to provide large data capacities along with efficient data input and retrieval. However, data storage systems employing numerous different data storage devices can experience errors and failures in one or more of those data storage devices, which can correspond with taking one or more devices offline while physical removal and replacement of the device(s) is undertaken. Such device removal and installation can be complicated, particularly in rack data storage systems where data storage devices are densely arranged. Hence, there is a continued interest in data storage systems with high data storage device density that are capable of efficient removal and installation of constituent data storage devices.

Such interest has resulted in a data storage system that has a number of data storage devices arranged into separate enclosures that are connected in a data storage module to span a single pair of rails and configured each with keyed couplers that mate to align the enclosures along a common plane between the single pair of rails. The keyed couplers can be configured to allow movement of at least one enclosure in response to force applied perpendicular to the common plane. The ability to disengage and remove an enclosure from a data storage rack with force simple upward force allows for minimally invasive data storage device removal. Also, the keyed enclosure configuration can reduce the weight and size of a data storage device tray, which can allow for more efficient rack space usage and increased data storage device density.

Figure 1:
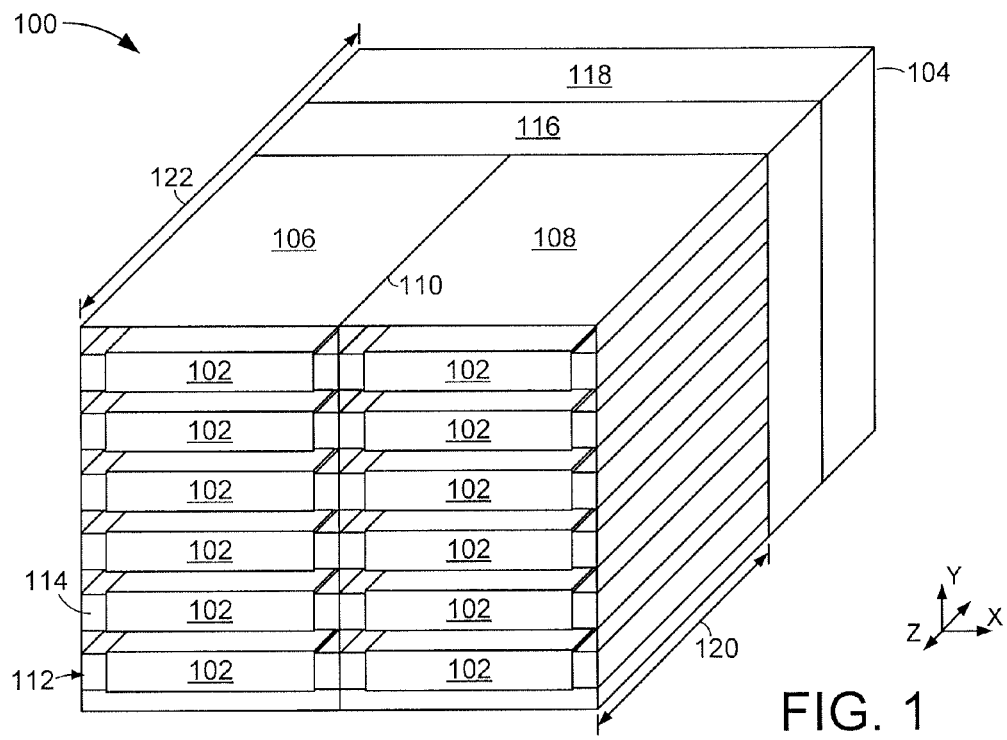
FIG. 1 shows an isometric line representation of a portion of an example data storage system configured in accordance with some embodiments.

It is contemplated that a data storage system can stand alone and be connected via any number of wired and wireless networks to any number of remote hosts and nodes. A data storage system may consist of at least one system processor that directs operation of at least one data storage device to store and retrieve data. Although a data storage device is not limited to any size, shape, function, format, or environment, various embodiments configure a data storage system 100 as illustrated in FIG. 1. The data storage system 100 has a plurality of enclosures 102 that can house one or more data storage devices. Each enclosure 102 can, in some embodiments, consist of a power source, processor, and cooling assembly.

An enclosure 102 can be configured to operate independently and concurrently with other enclosures housed in the rack 104. The rack 104 may be arranged in any number of configurations, such as being separated into first 106 and second 108 compartments that are bifurcated by a wall 110. Each compartment 104 and 106 can be further arranged into separate trays 112 which may, or may not, correspond to the size and shape of an enclosure 102 and be aligned along a common plane, such as the X axis. Each tray 112 can be defined by, but is not limited by, a pair of rails 114 that support the enclosure 102 and allow the enclosure 102 to be installed and removed efficiently. For example, the rails 114 can be static protrusions, casters, slides, and ball bearings that retain the enclosure 102 while allowing enclosure 102 movement.

In some embodiments, the rack 104 contacts a midplane 116 that is disposed between a cooling section 118 and each compartment 104 and 106. The cooling section 118 may consist of any number of passive and active cooling components, such as fans, heat fins, and liquid pumps, which can operate to reduce, control, and maintain various temperatures for the data storage system 100. The midplane 116 can be arranged as any number, type, and size of connectors that operably interconnect the various enclosures 102. That is, the midplane 116 can be configured to physically and electrically interconnect the enclosures 102 and trays 112 to allow individual and concurrent data flow to and from the various enclosures 102. The midplane 116, in some embodiments, is configured to efficiently pass air, fluid, and cabling from the cooling section 118 to the respective compartments 104 and 106.

It is noted that the rack 104 can be configured in any variety of manners to temporarily and permanently store data. The embodiment shown in FIG. 1 illustrates how the data storage enclosures 102 and compartments 104 and 106 can have a length 120 along the Z-axis that occupies a majority of the overall length 122 of the rack 104. However, assorted embodiments may tune the size of the enclosure length 120 to allow for a larger cooling section 118 and/or midplane 116. Regardless of the size of the enclosure length 120, the vertical stacking of multiple trays 112 and data storage devices allow for the rack 104 to have a large data storage capacity, such as 1 petabyte.

Although the rails 114, enclosures 102, and trays 112 are not limited to a particular configuration, size, or type, various embodiments construct the enclosures 102 to selectively slide into and out of the compartments 104 and 106. The ability to slide an enclosure can be facilitated with static and dynamic mechanisms that may consist of ball bearings. However, the structure and mechanism corresponding to the ability to slide an enclosure 102 can be costly in terms of weight and the production of debris. That is, rails 114 with ball bearings can generate particulate debris while being heavy and the enclosures 102 can be made of heavy frames to provide structural rigidity between the rails 114. Such heightened weight can be dangerous as access, removal, and installation of one or more enclosures 102 can be awkward and a safety hazard at low and high elevations in the rack 104.

Figure 2:
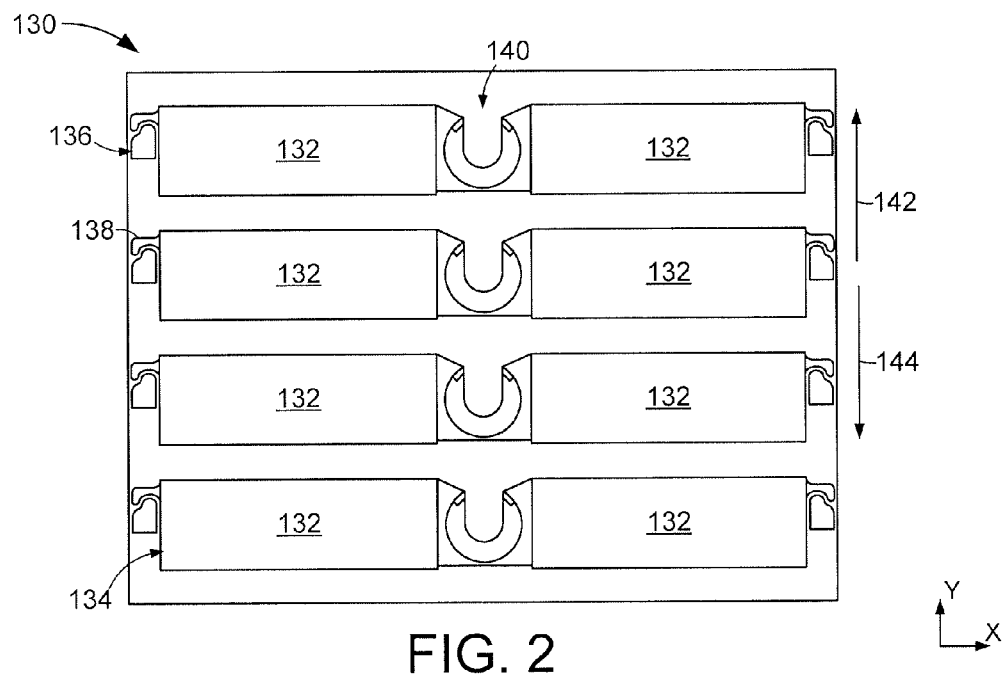
FIG. 2 conveys a front view line representation of a portion of an example data storage system arranged in accordance with some embodiments.

Accordingly, various embodiments configure at least a portion of the rack 104 to have interconnected enclosures 102 that are individually accessible and removable without taking adjacent enclosures 102 offline. FIG. 2 is a line representation of a portion of an example data storage rack 130 constructed and operated in accordance with some embodiments. The rack 130 is configured to provide interconnected data storage enclosures 132 that optimize the available space within the rack 130 and minimize the weight of the data storage trays 134.

Each enclosure 132 is contemplated to consist of one or more data storage devices, such as a rotating hard drive and solid-state memory array. The enclosures 132 can each stand alone as data storage systems, such as in a laptop, desktop, and tablet computer. In the example data storage rack 130 environment shown in FIG. 2, two enclosures 132 are aligned along a common plane, the X-axis between a pair of rails 136, to comprise a data storage tray 134. Although a single enclosure 132 may have protrusions 138 on opposite sides, along the X-axis, to engage the rails 134 and support the enclosure 132, various embodiments interconnect multiple enclosures 132 with a unidirectional hinge 140 that corresponds with each enclosure 132 having a single rail protrusion 138.

While the unidirectional hinge 140 is not limited to a particular size, shape, configuration, or position, two enclosures 132 can be joined into a data storage tray 134 with the unidirectional hinge 140. The unidirectional hinge 140 can be configured to allow movement of the tray 136 and individual enclosures 132 in the upward direction 142, along the Y-axis, while preventing tray 136 and individual enclosure 132 movement in the downward direction 144, along the Y-axis. That is, the unidirectional hinge 140 can be constructed and operated to maintain the enclosures 132 in alignment along the common plane, prevent enclosure 132 movement in the downward direction 144 regardless of the application of external force, and allow enclosure 132 movement in the upward direction 142 with the application of external force.

The tuned configuration of the unidirectional hinge 140 allows the rack 130 to have fewer rails 136 as each tray 134 spans a single pair of rails 136. In contrast to the enclosures 102, rails 114, and compartments of the rack 104 in FIG. 1, the unidirectional hinge 140 allows the wall 110 to be eliminated as well as half the number of rails 114, which saves enclosure 132 and tray 134 weight while optimizing the space within the rack 130. In other words, the unidirectional hinge 140 can supplant rack mounting hardware, such as rails 136 and rail protrusions 138, to allow trays 134 and enclosures 132 to be more densely positioned within the rack 130 without adding large amounts of weight to the rack 130. The elimination of various rack mounting hardware can also allow for increased space between enclosures 132 and trays 134 that can be utilized for heat transfer and cabling optimization.

The ability to reduce the amount of mounting hardware for each enclosure 132, tray 134, and rack 130 can correspond with multiple enclosures 132 continuously spanning the distance 144 between the rails 136, which may be greater than the width of one or more individual enclosures 132, along the X-axis. Hence, the unidirectional hinge 140 can allow enclosure 132 interconnection and tray 134 configurations that are more conducive to large data capacity racks 130 than racks having single enclosures 132 spanning between rails.

Figure 3:
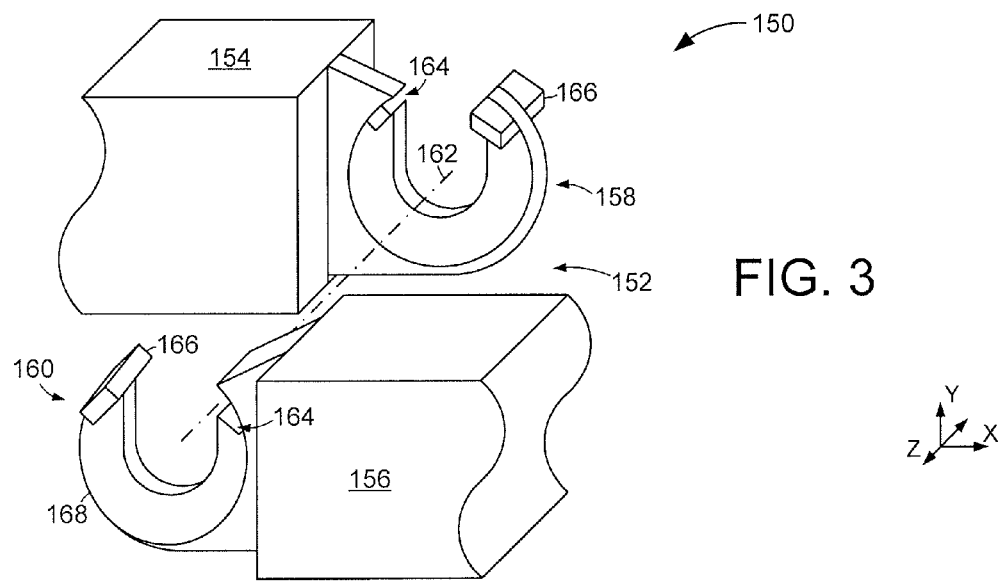
FIG. 3 is an isometric line representation of a portion of an example data storage system constructed and operated in accordance with some embodiments.

FIG. 3 illustrates a perspective view of a portion of an example data storage tray 150 configured in accordance with some embodiments to employ a unidirectional hinge 152 to interconnect first 154 and second 156 enclosures. It should be noted that an enclosure can be an individual data storage device, such as a hard drive, or a frame attached to one or more data storage devices. Various enclosure sizes, data storage types, weights, and shapes can be accommodated by configuring the unidirectional hinge 152 as an assembly of first 158 and second 160 features respectively secured to the first 154 and second 156 enclosures.

Positioning a unidirectional hinge feature on each enclosure allows the data storage tray 150 to be assembled and disassembled at will by connecting the hinge features 158 and 160 along a common axis 162. That is, mating the first 158 and second 160 hinge features can assemble the data storage tray 150. Although the unidirectional hinge 152 is not limited to a particular interconnection means, the example embodiment of FIG. 3 shows how each feature 158 and 160 can have a connection notch 164 and protrusion 166 that are similarly shaped to nest within one another and align the enclosures 154 and 156 along a common plane.

The size, shape, and position of the connection notches 164 and protrusions 166 are not limited. However, some embodiments configure each connection means to allow rotational engagement and disengagement of the protrusion 166 of each feature 158 and 160 with the notch 164 of each feature 158 and 160. FIG. 3 displays how the connection protrusion 166 and notch 164 can respectively be oriented in opposite directions, which can allow the enclosures 154 and 156 to be physically connected, but not locked into alignment along a common plane until the enclosures 154 and 156 are positioned into planar alignment. That is, the unidirectional hinge features 158 and 160 can physically contact and support each other without being locked in alignment along a common plane. The ability to interconnect the enclosures 154 and 156 in this way provides additional safety and efficiency when installing the data storage tray 150 in an elevated position within a data storage rack, such as rack 130.

The unidirectional hinge features 154 and 156 may also be configured to have matching dimensions that interconnect via the mirrored orientation associated with the first 154 and second 156 enclosures. The ability to tune the configuration of the unidirectional hinge features 158 and 160 allows an assembled data storage tray 150 to be assessed as a unitary formation and disassembled simply by providing external force upward on a selected enclosure to disengage the connection notches 164 from the connection protrusions 166. It is contemplated that the unidirectional hinge feature 158 and 160 can be configured to allow one enclosure 154 and 156 to remain physically and electrically connected to a midplane of a data storage rack while another enclosure of the data storage tray is disengaged from the unidirectional hinge 152.

As shown, each unidirectional hinge feature 158 and 160 has a cantilevered frame 168 that provides a service aperture between the connection notch 164 and protrusion 166. The service aperture can be a partial or complete hole, notch, or groove in the cantilevered frame 168 that accommodates service equipment, such as electrical cabling, cooling ducts, and fasteners. For example, the unidirectional hinge features 158 and 160 can each have service apertures that match and align only when the enclosures 154 and 156 are aligned along a single plane, which can be secured by one or more fasteners, such as a pin, screw, and knob, occupying the service aperture.

Figure 4:
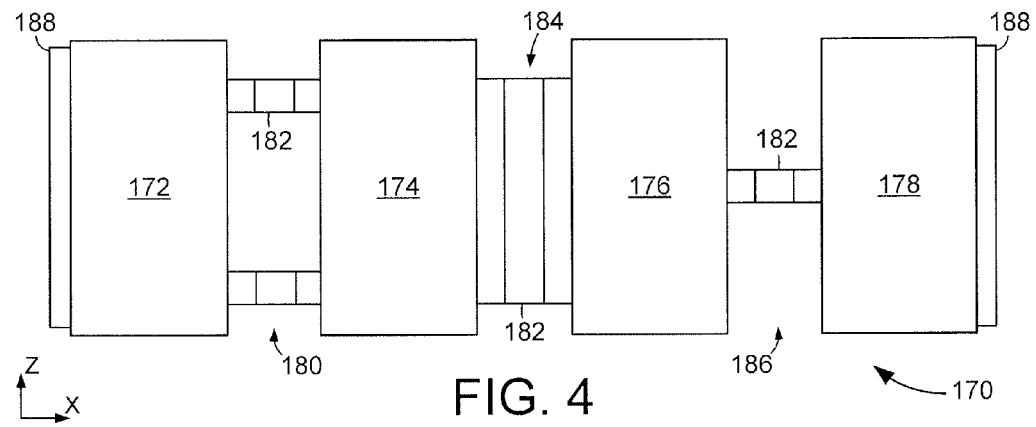
FIG. 4 illustrates a top view line representation of an example data storage tray configured in accordance with some embodiments.

Through the various structural and operational configurations of the unidirectional hinge features 158 and 160, any number of enclosures 154 and 156 can be interconnected in a modular manner to form a unitary tray 150 that is aligned along a common plane. FIG. 4 depicts a top view line representation of an example data storage tray 170 employing differently configured unidirectional hinges in accordance with assorted embodiments. While the data storage tray 170 may have numerous unidirectional hinges configured with matching shapes and positions relative to first 172, second 174, third 176, and fourth 178 enclosures, the non-limiting embodiment of FIG. 4 illustrates how hinges with different positions and shapes can be utilized at will to interconnect and align the enclosures along a common plane.

The first unidirectional hinge 180 utilizes multiple separate hinge features 182 to interconnect the first and second enclosures 172 and 174 while the second unidirectional feature 184 is configured as a single hinge feature with a size that continuously extends along a majority of the space between the second 174 and third 176 enclosures. It can be appreciated that the physically larger second unidirectional hinge 184 can provide increased strength compared to the third hinge 186, but may be more awkward to assemble and disassembly due to greater surface area being aligned. Regardless of the size, number, and position of the unidirectional hinges 180, 182, and 184, the hinge features 182 can be tuned to provide ample support and safety to maintain the planar alignment of the enclosures 172, 174, 176, and 178 without adding undue weight between the rail protrusions 188 of the data storage tray 170.

Figure 5:
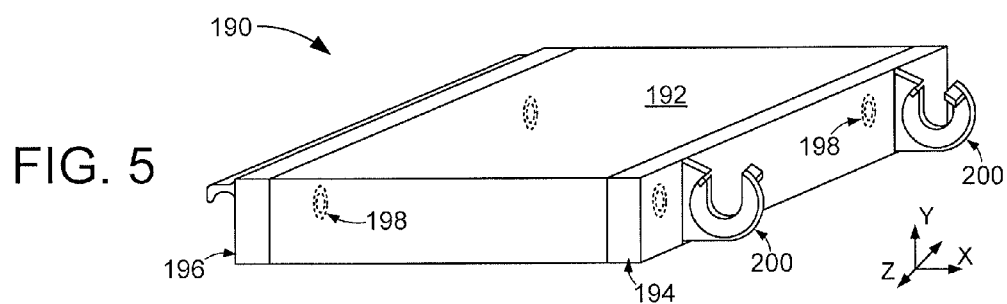
FIG. 5 depicts an isometric line representation of an example modular data storage device configured in accordance with some embodiments.

FIG. 5 shows a perspective line representation of an example modular data storage enclosure 190 that may be employed in the data storage trays provided in FIGS. 2 and 4 in accordance with various embodiments. The enclosure 190 has a central portion 192 that may be a single data storage device, an enclosed frame, or an open frame housing multiple data storage devices concurrently. The ability to mount similar and dissimilar connecting features 194 and 196 to the central portion 192 allows the enclosure 190 to be modular, which can be characterized as configurable to be interconnected within a data storage tray and rack in a variety of manners.

The non-limiting example of FIG. 5 illustrates how the central portion 192 can have a rail protrusion connecting feature 196 mounted to a first side and a unidirectional hinge connecting feature 194 on an opposite side, along the X-axis. Each connecting feature 194 and 196 can be temporarily and permanently attached to the central portion 192 via one or more fasteners 198, such as rivets, screws, magnets, grooves, and hooks. With the connection features 194 and 196 being attached via at least one fastener, the features 194 and 196 can be removed and replaced efficiently. For instance, the separate, centrally disposed hinge features 200 of the connection feature 194 can be quickly and easily replaced by a single, centrally located hinge feature, such as hinge 184 of FIG. 4, without damaging the central portion 192.

The ability to reconfigure the connection features 194 and 196 with respect to the central portion 192 allows the central portion 192 to be utilized in a diverse variety of positions within a data storage tray and rack. For example, a central portion 192 may be configured with the connections features 194 and 196 shown in FIG. 5 prior to a data storage device housed in the central portion 192 malfunctioning, the unidirectional hinge features 200 being disengaged from the remainder of a data storage tray, one or both connection features 194 and 196 being disassembled from the central portion 192, at least one different connection feature being attached to the central portion, and the central portion 192 being installed into a different data storage tray and location with a data storage rack.

FIG. 6 depicts a top view line representation of an example data storage tray 210 configured in accordance with assorted embodiments to interconnect multiple enclosures 212 along multiple different axes. As shown, an enclosure 212 can have unidirectional hinge features 214 extending along different axes, such as orthogonal X and Z axes. Positioning a predetermined, and unlimited, number of unidirectional hinges and hinge features along different surfaces of an enclosure 212 allows the data storage tray 210 to extend along the X and Z axes while being aligned along a common plane, such as the Z axis. The position of multiple enclosures along the X axis can be characterized as different levels, which is different than the different trays 134 of FIG. 2.

In comparison to the 2×1 data storage tray configuration of FIG. 2 and the 4×1 data storage tray configuration of FIG. 4, placement of the unidirectional hinges 214 on different surfaces of the enclosure 212 allows for a 2×3 data storage tray configuration between a pair of rails. Each enclosure 212 is configured with a rail protrusion 216 that can individually and concurrently engage one or more rails, but such configuration is not limiting as less than all the enclosures 212 may be configured without a rail protrusion 216 to save weight. As a non-limiting example, the rail protrusions 216 of multiple enclosures 212 can interconnected via unidirectional hinges 214 and concurrently supported by a single common rail.

It is contemplated that unidirectional hinges 214 with different sizes, positions, and weights can be concurrently utilized to provide the 2×3 array displayed in FIG. 6. For example, a first unidirectional hinge 214 configuration may be used to interconnect enclosures 212 along the Z-axis while a different unidirectional hinge configuration may be used to interconnect enclosures along the X-axis. It is further contemplated that individual midplanes can be employed for the respective enclosures 212 to permit servicing flexibility, instead of routing cables and electrical interconnects to each enclosure 212 separately.

Through the tuned configuration of enclosures, unidirectional hinges, and rails, a data storage tray 210 can be customized to have any number of data storage devices and have various shapes and sizes to accommodate data storage racks with different configurations. That is, the unidirectional hinges, rail protrusions, and central portions can be selected, assembled, and deployed in configurations that accommodate data storage racks with diverse sizes, shapes, electrical connections, and cooling capacities. Additionally, the unidirectional hinge can save data storage tray weight by allowing multiple data storage enclosures to span a pair of rails while allowing for efficient enclosure access by applying upward force on a selected enclosure.

The tuned utilization of unidirectional hinges can open space in a data storage rack otherwise occupied by heavy-duty frames, supports, and enlarged enclosure frames. FIGS. 7A-7C respectively display top view line representations of an example linkage assembly 220 that can be used to physically and electrically interconnect the enclosures 212 of FIG. 6 in accordance with various embodiments. The linkage assembly 220 has an actuator 222 that rotates around a pivot pin 224 to allow a connection feature 226 to contact secure to a post portion 228 of a connector 230. FIG. 7A shows an unmated position of the actuator 222 where the connection feature 226 is not contacting the connector 230, linkage pin 232, or outer sleeve 234 of an electrical feature 236.

FIG. 7B shows the actuator 222 contacting the connector 230 and linkage pin 232, but not being electrically engaged due to the linkage pin being separated from the outer sleeve 234 of the electrical feature 236. Through manual or automatic rotation of the actuator 222, electrical connection can be established as the linkage pin 232 is forced into contact with the outer sleeve 234, which can close an electrical circuit from the connector 230 to the inner sleeve 238 of the electrical feature 236, as shown by FIG. 7C.

It is contemplated that the actuator 222, linkage pin 232, electrical feature 236, and connector 230 can individually and collectively be tuned for size, shape, and position to optimize the establishment of an electrical connection between a service module and a service chamber. For instance, various levers and springs can be utilized during physical attachment of the service module and chamber to rotate the actuator from the position shown in FIG. 7A to the position shown in FIG. 7C to secure an electrical connection.

FIGS. 8A-8C respectively present line representations of portions of an example electrical feature 250 that may be employed in accordance with some embodiments. Although not limiting, the electrical feature 250 can have at least a pair of separate conducting plates 252 that respectively engage fingers 254 of different frames 256, as shown in FIG. 8A. A conducting plate 252 can be disposed between multiple frames, such as frames 256 and 258, that can independently and concurrently move to establish physical and electrical contact between the conducting plates 252.

In FIG. 8A, solid arrow 260 illustrates how current cannot transfer between the conducting plates 252. FIG. 8B corresponds with physical contact between the conducting plates 252, but insufficient mating to conduct the current. The second frame 258 contacting the frame 256 of the first conducting plate 252 restricts physical contact of the conducting plates 252 and the formation of an electrically conductive connection. FIG. 8C shows how additional force can be applied to the frame 256 of FIG. 8B to allow uninhibited contact between the conducting plates 252 and establish a completed electrical connection, as shown by current 382 translated through both conducting plates 252. It is noted that the operation shown in FIGS. 8A-8C can correspond with manipulation of a linkage assembly, like assemblies 220.

Turning to FIGS. 9A-9E, various portions of an example data storage system 270 are illustrated as configured in accordance with assorted embodiments. FIG. 9A shows a front view line representation of an example data storage tray 272 that consists of vertically stacked data storage enclosures 274 that are secured by a single pair of rails 276 within a rack frame 278. The vertical stacking of the enclosures 274 can optimize space in the data storage rack 278 and increase the efficiency of data storage tray 272 access. The vertical configuration of the enclosures 274 may be efficient in terms of space utilization, but can be inefficient in terms of taking enclosures offline during service. That is, the physical configuration of the enclosures 274 can correspond with all the enclosures 274 of the tray 272 being taken offline to access, remove, or install an enclosure 274.

FIG. 9B shows how a portion of the data storage tray 272 can be configured with a locking mechanism 240 that can maintain an enclosure's 274 position despite removal of an adjacent enclosure 274. As displayed, a locking plate 282 can rotate about a pivot 284 in response to contact with a service pin 536 to engage a retention feature 288 of a frame 290. In operation, but in no way limiting, the service pin 286 can be utilized to engage the locking mechanism 530 prior to the removal of an enclosure 524 from a tray 522 to ensure the position and support of the non-accessed enclosures 524.

In FIG. 9C, a side view block representation of a rail 276 conveys how a protrusion 292 of at least one enclosure 274 can fit within a rail channel 294 to be supported and maintained. A retention feature 296 can be position in and around the channel 294 to position the protrusion 292 in a predetermined portion of the channel 294. IN accordance with various embodiments, at least one enclosure 274 can be removed from the data storage tray 272 without taking the other enclosures offline. FIGS. 9D and 9E respectively illustrate how a tool 298 can be configured to engage opposite sides 300 and 302 with one or more engagement features 304, such as a caster, roller, or low-friction surface. FIG. 9D displays how the tool 298 can be positioned initially before being rotated to a deployed state, as shown in FIG. 17E where the engagement features 304 concurrently engage and support a plurality of enclosures 274.

In other words, the tool 298 can be inserted in between enclosures 274 of a tray 272 and rotated to support respective bottom surfaces 306 and 302 of top and middle enclosure 274 by contacting a top surface 308 of a bottom enclosure 274. The deployed position of the tool 298 in FIG. 9E conveys how the middle and top enclosures 274 can be individually and collectively accessed, removed, and replaced without physically or electrically disconnecting the bottom enclosure 274. Hence, the utilization of one or more tools 298 allows the vertically stacked data storage tray 272 configuration to be viable in terms of service, management, and maintenance.

As shown FIGS. 9A-9B, various embodiments consist of a two-part tool designed to eliminate the need to incorporate drawer rails for each individual tray or layer in an individual enclosure. The tool may be used with arrays such as the Monolithic or Modular Carriers to provide access to individual layers for service. Use of the aforementioned carriers is predicated on both a cabled design and the use of individual 'midplanes' across the back of each array. These 'midplanes' are then cabled to the expander itself to provide the required flexibility to permit service in the intended fashion.

FIG. 10 displays a modular enclosure routine 310 that can be executed in accordance with various embodiments. The routine 310 initially affixes at least one keyed coupler and a rail protrusion to opposite sides of first and second enclosures in step 312. The keyed couplers of the respective first and second enclosures are then mated in step 314 by rotating the enclosures so that a protrusion of a first keyed coupler physically engages a notch of a second keyed coupler. As a result of the mating of the keyed couplers of the respective enclosures, the first and second enclosures are aligned along a common plane.

It is contemplated that the keyed couplers are maintained in mated contact that aligns the enclosures solely by gravity. That is, no fasteners or adhesive extend between the enclosures. Next in step 316, the first and second enclosures are collectively slid into place upon a single pair of rails. The mated keyed couplers allow a single pair of rails to suspend multiple enclosures instead of each enclosure being suspended between by a pair of rails, which saves weight, manufacturing cost, and cooling capabilities of a data storage rack that employs the keyed couplers.

While the suspended enclosures can remain aligned along the common plane for any period of time, maintenance, replacement, and service may be scheduled, which corresponds with removal of one, or both, enclosures. Step 318 illustrates how applying force opposite to the force of gravity on the keyed couplers allows the enclosures to physically rotate and the keyed couplers to disengage. It is noted that the steps of routine 310 are not required or limiting and aspects can be changed, removed, or added at will. For example, the steps may be altered to align more than two enclosures along the common plane, as shown in FIGS. 4 and 6.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising first and second enclosures suspended by a single pair of rails in a rack, the first and second enclosures each having keyed couplers that mate to align the first and second enclosures along a common plane between the single pair of rails, each keyed coupler having a frame cantilevered from the respective enclosures, each frame comprising a notch separated from a protrusion by a service aperture, a first notch of a first keyed coupler of the first enclosure sized to secure a first protrusion of a second keyed coupler of the second enclosure to allow movement of the first and second enclosures in a first direction opposite and parallel to gravity and prevent movement of the first and second enclosures in a second direction corresponding to gravity.

2. The apparatus of claim 1, in which each enclosure houses at least one data storage device.

3. The apparatus of claim 1, in which each keyed coupler is a unidirectional hinge rotating about a common axis extending through the service apertures of each keyed coupler in response to force applied in the first direction and preventing rotation about the common axis in response to force applied in the second direction.

4. The apparatus of claim 1, in which each enclosure is disposed between a rail protrusion and the keyed coupler along the common plane.

5. The apparatus of claim 4, in which the rail protrusion slidingly contacts a first rail of the single pair of rails and is maintained in contact with the first rail by gravity.

6. The apparatus of claim 1, in which the keyed couplers of the first and second enclosures have mirrored orientations.

7. The apparatus of claim 1, in which the frame of the first keyed coupler is oriented opposite the frame of the second keyed coupler.

8. The apparatus of claim 1, in which the first protrusion is secured in the first notch concurrently while a second protrusion of the second keyed coupler is secured by a second notch of the second keyed coupler to retain the first and second enclosures along the common plane.

9. The apparatus of claim 1, in which the keyed couplers are rotated about a common axis to engage the first notch with the first protrusion, the common axis oriented parallel to the common plane.

10. The apparatus of claim 1, in which a weight of each enclosure forces the first protrusion into the first notch.

11. A system comprising first and second enclosures in different layers attached to and suspended by a single support rail in a rack, first and second keyed couplers attached to the respective first and second enclosures, the keyed couplers configured to mate and align the first and second enclosures to the single support rail, each keyed coupler having a frame cantilevered from the respective enclosures, each frame comprising a notch separated from a protrusion by a service aperture, a first notch of a first keyed coupler of the first enclosure sized to secure a first protrusion of a second keyed coupler of the second enclosure to allow movement of the first and second enclosures in a first direction and prevent movement of the first and second enclosures in a second direction.

12. The system of claim 11, wherein each keyed coupler is attached via a fastener.

13. The system of claim 11, wherein third and fourth keyed couplers physically connect the respective first enclosure to a third enclosure and the second enclosure to a fourth enclosure.

14. The system of claim 11, wherein the first and second keyed couplers continuously extend along a majority of a length of the first and second enclosures.

15. The system of claim 11, further comprising individual midplanes that attach to the first and second enclosures to permit servicing flexibility.

16. A method comprising:
attaching a first keyed coupler to a first enclosure, the first keyed coupler comprising a first frame cantilevered from the first enclosure, the first frame having a first notch separated from a first protrusion by a first service aperture;

attaching a second keyed coupler to a second enclosure, the second keyed coupler comprising a second frame cantilevered from the second enclosure, the second frame having a second notch separated from a second protrusion by a second service aperture;

mating the first protrusion and the second notch to secure the keyed couplers together and to align the first and second enclosures along a common plane and allow movement of the first and second enclosures in a first direction opposite and parallel to gravity while preventing movement of the first and second enclosures in a second direction corresponding to gravity; and suspending the first and second enclosures between a single pair of rails.

17. The method of claim 16, in which the keyed couplers maintain alignment of the first and second enclosures by gravity forcing the second protrusion in the first notch.

18. The method of claim 16, in which the keyed couplers are disengaged by applying force in the first direction.

19. The method of claim 16, in which the keyed couplers are mated by rotating the first enclosure relative to the second enclosure.

20. The method of claim 16, wherein the first and second enclosures form a tray and multiple trays are concurrently positioned in a rack with each tray being suspended between a single pair of rails and separated from other trays.

* * * * *